United States Patent [19]

Burns et al.

[11] Patent Number: 4,560,826
[45] Date of Patent: Dec. 24, 1985

[54] HERMETICALLY SEALED CHIP CARRIER

[75] Inventors: Carmen Burns, Hershey; Dimitry Grabbe, Middletown, both of Pa.

[73] Assignee: AMP Incorporated, Harrisburg, Pa.

[21] Appl. No.: 566,769

[22] Filed: Dec. 29, 1983

[51] Int. Cl.⁴ .............................................. H01L 23/02
[52] U.S. Cl. ................................. 174/52 FP; 357/74
[58] Field of Search .......... 174/52 FP, 68.5, 126 GP; 361/399, 414, 409; 357/74

[56] References Cited

U.S. PATENT DOCUMENTS

| | | | |
|---|---|---|---|
| 3,296,364 | 1/1967 | Mason | 174/126 R X |
| 3,558,993 | 1/1971 | Rigby | 174/52 FP |
| 4,000,842 | 1/1977 | Burns | 357/71 X |
| 4,142,287 | 3/1979 | Grabbe | 357/70 X |
| 4,172,919 | 10/1979 | Mitchell | 428/209 |
| 4,188,438 | 2/1980 | Burns | 428/209 |
| 4,195,193 | 3/1980 | Grabbe et al. | 357/70 X |
| 4,209,355 | 6/1980 | Burns | 357/70 X |
| 4,259,436 | 3/1981 | Tabuchi et al. | 357/70 X |
| 4,288,841 | 9/1981 | Gogal | 361/414 |
| 4,330,790 | 5/1982 | Burns | 174/52 PE X |
| 4,355,463 | 10/1982 | Burns | 174/52 FP X |

*Primary Examiner*—A. T. Grimley
*Assistant Examiner*—D. A. Tone
*Attorney, Agent, or Firm*—Donald M. Boles

[57] ABSTRACT

A device for producing a hermetically sealed chip carrier is taught. Briefly stated, a sealing or perimeter ring is formed on a substrate with an appropriate lead pattern and IC chip contained within this ring. Vias or ducts are disposed in the substrate with metal lead pedestals contained therein which provide electrical connection through the substrate and therefore between the lead pattern contained inside the sealing ring and the lead patterns on the outside of the sealing ring. This therefore allows for a continuous sealing ring such that a cap may be placed on top of the sealing ring and bonded by methods such as welding so as to form a hermetically sealed enclosure.

17 Claims, 5 Drawing Figures

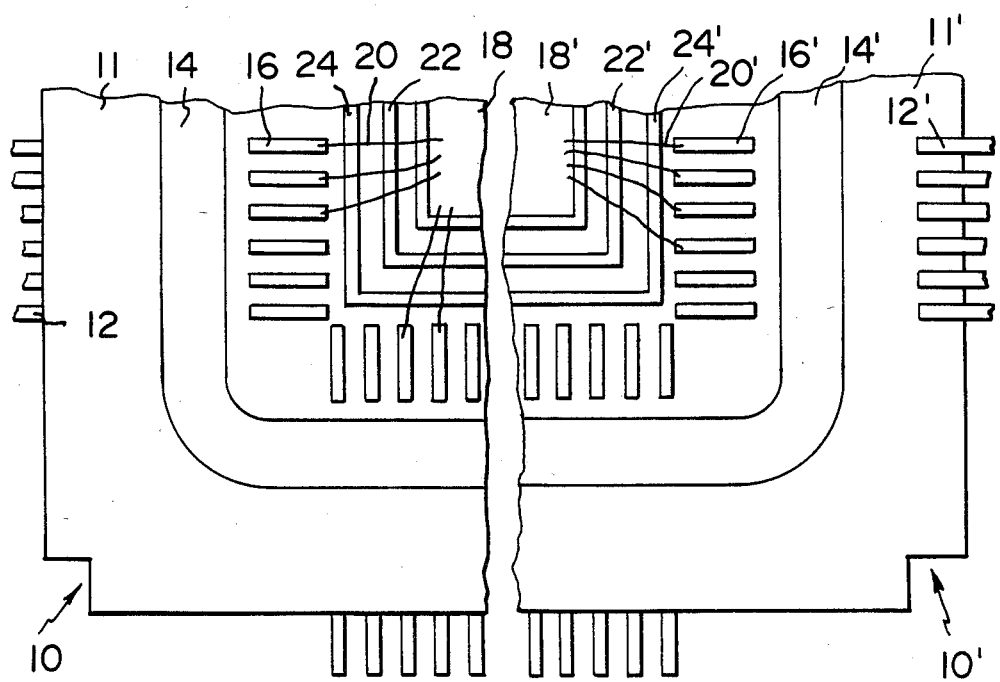
FIG.1A  FIG.1B
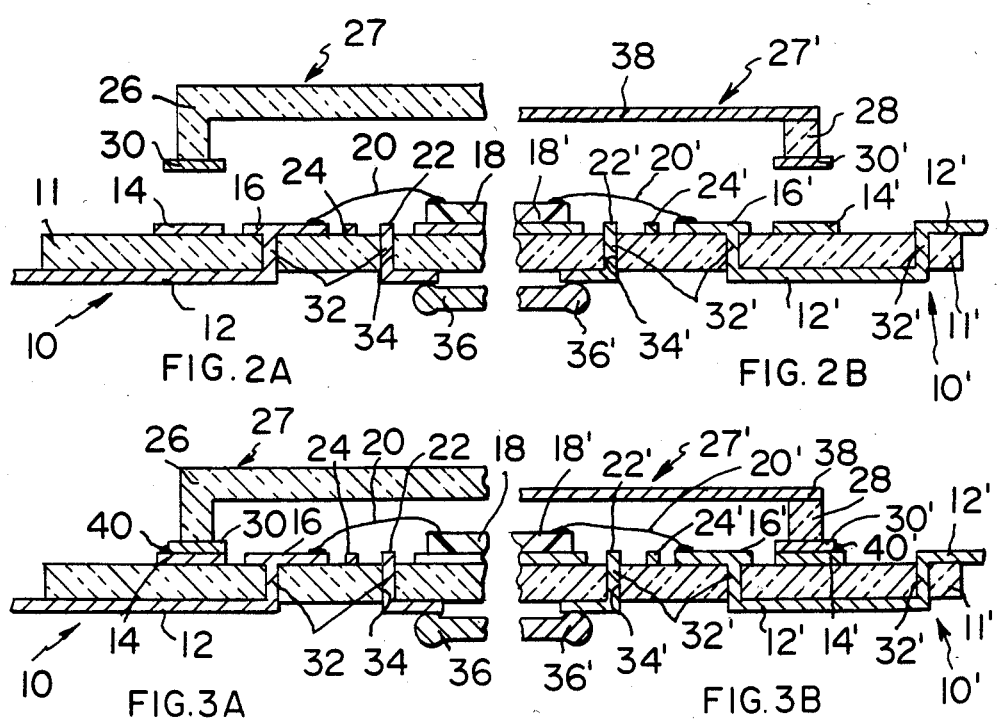
FIG.2A  FIG.2B
FIG.3A  FIG.3B

HERMETICALLY SEALED CHIP CARRIER

BACKGROUND OF THE INVENTION

This invention relates, generally, to an integrated circuit ceramic substrate interface and more particularly to the hermetically sealing of the interface.

There is a continuing need in industry as well as military for chip carriers which are reliably and inexpensively hermetically sealed. This need for hermetic sealing is quite important since a minimum of moisture which may leak into a package is extremely troublesome and expensive to diagnose and repair. A number of methods have been tried, one of which is found in U.S. Pat. No. 4,355,463, "Process for Hermetically Encapsulating Semi-Conductor Devices" issued Oct. 26, 1982 to Burns. Traditional methods of hermetic sealing have required that the chip carrier and the IC chip contained therein be elevated to temperatures which will melt glass which is typically the sealing or gasket material. However, this presents a multitude of problems in addition to the potential high temperature problems which may damage the IC chip. These problems relate to glass breakage during thermal cycling which thereby breaks the seal, adhesion problems between the lead frames utilized and the substrate upon which they are deposited on, or the generation of water as a by-product.

Therefore, it is desirable to have a hermetically sealable chip carrier which is relatively inexpensive and which forgoes the high temperature processing of present techniques. Additionally, it is also desirable to have a device which does not use glass and does not experience water problems associated with high temeraptures. Such a device is taught by the present invention.

Accordingly, the present invention teaches and as an object of the present invention, a hermetic chip carrier comprising a substrate, a chip disposed on the substrate, inner leads disposed on the substrate on the same side as the chip, a sealing ring disposed on the same side of the substrate as the chip, outer leads disposed on the substrate on the side opposite the chip in a pattern corresponding to the inner leads, a pedestal disposed in vias in the substrate, the pedestal electrically interconnecting the inner leads to corresponding outer leads, the outer leads being disposed on the substrate on the side opposite the chip and a diaphragm having a sealing skirt attached thereto wherein the sealing skirt is disposed on and attached to the sealing ring.

BRIEF DESCRIPTION OF THE DRAWINGS

Reference is now made to the description of the preferred embodiment illustrated in the accompanying drawings in which:

FIGS. 1A and 1B are illustrative plan views of two embodiments of the present invention;

FIGS. 2A and 2B are side cross-sectional views taken through FIGS. 1A and 1B respectively showing the construction of the present invention: and FIGS. 3A and 3B are views similar to that of FIGS. 2A and 2B illustrating the assembled structure of the present invention.

DETAILED DESCRIPTION OF THE PREFERRED EMBODIMENT

It is to be understood that components or parts of the present invention which are similar to a previously described component or part will be given the same number with the addition of a prime (').

Referring now to FIG. 1A, a plan view of one embodiment of the present invention is shown. An IC package shown generally at 10 is comprised of a substrate 11 having outer leads 12 emanating therefrom. Disposed on the substrate 11 is a seal ring 14 with inner leads 16 disposed around the integrated circuit chip 18. Data leads 20 interconnect the inner leads 16 to the appropriate portions of the integrated circuit chip 18. A power bus 22 and a ground bus 24 are disposed therearound for supplying the appropriate electrical power to the integrated circuit chip 18.

Referring now to FIG. 1B, it can be seen that almost all details are exactly the same with the exception that the outer leads 12' are disposed on top of the substrate 11' as opposed to under the substrate 11 as shown in the embodiment of FIG. 1A and which is more readily apparent in FIG. 2A through 3B. This difference in lead patterns is merely to illustrate an accommodation of different pin-out pattern preferences where the outer leads 12, 12' emanate from the package 10, 10' in different manners. In this approach, leaded or leadless chip carrier packages with the leads on the side of the chip or underside may be made.

Referring now to FIG. 2A, there is shown a cross-sectional view taken through FIG. 1 illustrating the construction of the present invention. Shown is a ceramic cap 26 which is attached to a sealing skirt 30 which together form a rigid diaphragm 27. Shown also is how the outer leads 12 are interconnected with the inner lead 16. This is accomplished by a lead pedestal 32 which is disposed in a "via" or duct 34. Shown also is a capacitor 36 which is normally used for transient suppression but may be omitted without departing from the spirit and scope of the present invention. Similarly in FIG. 2B, the connection between the inner and outer leads 12', 16', are accomplished in the same manner. However, as can be seen here, the outer lead 12' is disposed underneath the substrate 11' and is then brought through the substrate 11' to the top of the substrate through use of a lead pedestal 32' and a via 34'. Also of a different nature in FIG. 2B is the use of a membrane 38 in conjunction with a ceramic ring 28 which are then attached to the sealing skirt 30' which together form a flexible or resilient diaphragm 27'. The vias or ducts 34 in the preferred embodiment of the present invention are manufactured by first forming or drilling holes in the substrate 11, 11'. These holes in the substrate 11, 11' thereby form vias 34 which when filled with metal facilitate the flow of electrical current therethrough. In the preferred embodiment of the present invention, this is accomplished by the use of small beads of metal (not shown) which are appropriately placed over the vias and through heating are allowed to melt and thereby completely fill the via 34, 34' so as to form a lead pedestal 32, 32'. However, a number of different metals as well as methods for the deposition of the pedestals may be utilized for the vias 34, 34' without departing from the spirit and scope of the present invention. These may include filling the vias by a copper-copper oxide eutectic, filling the vias using copper fluoride-copper film, filling the vias by casting, mechanical pressing or with copper clad INVAR type wires comprised of a steel-nickel alloy having a low coefficient of expansion. Therafter the lead patterns 12, 16 as well as the power and ground buses 22, 24 and the sealing ring 14 are bonded to the substrate. It is to be understood that although the seal ring 14 as well as the leads 12, 16 and buses 22, 24 are copper which is diffusion bonded to the substrate 11, other metals and methods of bonding can and may be utilized without departing from the spirit and scope of the present invention.

Referring now to FIG. 3A, there is shown a cross sectional view of the present invention in an assembled form. Here it can be seen that the sealing skirt 30 is bonded to the seal ring 14 which may be done in a number of ways known to one skilled in the art such as soldering, laser welding, electron beam welding or resistance welding. In this manner, a diaphragm 27 is formed which thereby hermetically seals the IC chip 18 therein. Similarly, in referring to FIG. 3B, the same type of bond is formed between the seal skirt 30' and the sealer ring 14' thereby exhibiting a joint seal area 40, 40'. This joint seal area 40, 40' forms a copper interface which is significantly more ductile and compliant than traditional glass seals and provides a higher degree of reliability in thermal cycling situations. Further, sealing may be accomplished under a variety of different conditions, such as sealing in a vacuum, sealing at elevated pressures, or sealing with the use of gasses such as nitrogen with a 8-15% hydrogen mixture. The diaphragm 27' of FIG. 2B differs from that of FIG. 2A to show those situations where it is desirable to have an integral indicator of the integrity of the hermetic properties of the package. In this manner, this membrane 38 may consist of a copper or other metal membrane which would thereby permit welding of the seal skirt 30' in an atmosphere of elevated pressure thereby forcing the membrane 38 to assume a shape similar to that of a balloon or in a vacuum thereby collapsing the membrane 38. Therefore, in the event the integrity of the hermetic seal is violated, the membrane 38 will collapse, deform or pop-up thereby giving an indication of its defective condition. Additionally, this would also allow for the position of the diaphragm to be sensed electrically by a number of methods such as capacitive or electrical contact apparatus which may or may not be internal to the diaphragm 27, 27 thereby providing verifiable hermeticity status. Further, a number of different types of diaphragms 27, 27' may be utilized such as completely metal membranes or the use of glass or crystal windows.

Accordingly, the use of the vias 34 and the lead pedestals 32 allows the seal ring 14 to completely encapsulate the IC chip 18 and all connections, be them power or data, therein. Since the seal ring 14, 14' or the substrate 11, 11' need not accommodate for the thickness of the outer leads 12, 12' as well as deformations which may occur, direct bonding of the seal ring 14, 14' to the substrate 11, 11' may be accomplished in a reliably consistent and accurate manner. Further, the sealing ring 14, 14' may be a compliant member and may be extended to the perimeter of the substrate 11, 11' thereby providing a reference ground plane so as to reduce cross-talk on signal lines as well as balancing mechanical stresses which may be in the package 10, 10'.

It is to be understood that many departures from the disclosure as cited may be accomplished without departing from the spirit and scope of the present invention. For example, the lead pedestals may be formed from shapes other than beads and may be pressed into place as opposed to melting and thereby flowing into the vias. Further, the inner and outer leads as well as the lead pedestal and the buses together with the seal ring may be formed all at the same time. Also a number of different types of substrate materials may be utilized such as ceramic or glass without departing from the spirit and scope of the present invention. Additionally, different methods of diaphragms or covers may be utilized as well as different lead patterns which may therefore provide for a leadless or a leaded IC package.

Therefore, in addition to the above numerated advantages, the disclosed invention produces a device which is relatively easy to manufacture, providing a high degree of reliability and which is relatively inexpensive.

We claim:

1. A hermetic chip carrier, comprising:
   a substrate;
   a chip disposed on said substrate;
   inner leads disposed on said substrate on the same side as said chip;
   a sealing ring disposed on the same side of said substrate as said chip;
   electrical power and ground busses disposed adjacent said inner leads;
   outer leads disposed on said substrate on the side opposite said chip in a pattern corresponding to said inner leads and said electrical power and ground busses;
   pedestal disposed in vias in substrate, said pedestal electrically interconnecting said inner leads and said electrical power and ground busses to corresponding outer leads; and
   a diaphragm having a sealing skirt attached thereto wherein said sealing skirt is disposed on and attached to said sealing ring.

2. The device according to claim 1 wherein said chip carrier comprises a leadless integrated circuit chip carrier.

3. A device according to claim 1 wherein said hermetic chip carrier comprises a leaded chip carrier.

4. A device according to claim 1 wherein said sealing skirt is attached to said sealing ring by soldering.

5. A device according to claim 1 wherein said sealing skirt is attached to said sealing ring by welding.

6. A device according to claim 1 wherein said pedestals are comprised of a copper fluoride-copper film.

7. A device according to claim 1 wherein said pedestals are deposited in said vias by casting.

8. A device according to claim 1 wherein said pedestals are formed by mechanically pressing of metal into said vias.

9. A device according to claim 1 wherein said pedestals are comprised of copper clad steel-nickel alloy wires.

10. A device according to claim 1 wherein said sealing ring comprises a relatively compliant member.

11. A device according to claim 1 wherein said diaphragm is composed of a ceramic cap having said sealing skirt attached thereto.

12. A device according to claim 1 wherein said diaphragm is comprised of a membrane having a ceramic ring attached thereto with said sealing skirt attached to said ceramic ring.

13. A device according to claim 1 wherein said diaphragm has a glass or relatively optically clear portion therein thereby enabling the visual viewing of said chip and said leads disposed in said hermetic chip carrier.

14. A device according to claim 1 wherein said membrane is comprised of a metal flexible member.

15. A device according to claim 1 wherein said sealing skirt is attached to said sealing ring in an atmosphere of either elevated, pressure or in a partial vacuum and having a diaphragm further characterized in that;

said diaphragm is of a flexible material thereby collapsing or bulging respectively should the hermetic chip carrier develop a leak.

16. A device according to claim 15 wherein a signal means is utilized to detect the movement of said diaphragm and thereby provide an indication of hermeticity integrity failure.

17. A device according to claim 1 wherein said sealing ring is disposed adjacent the outer perimeter of said substrate thereby providing a reference ground plane so as to minimize cross-talk between adjacent signal lines as well as balancing and therefore minimizing mechanical stresses to the substrate.

* * * * *